US006893498B1

(12) United States Patent
Miller et al.

(10) Patent No.: US 6,893,498 B1
(45) Date of Patent: May 17, 2005

(54) METHOD AND APPARATUS FOR ADJUSTING LITHIUM OXIDE CONCENTRATION IN WAFERS

(75) Inventors: Gregory D. Miller, Foster City, CA (US); Ludwig Galambos, Menlo Park, CA (US); Janos Lazar, Redwood City, CA (US); Gabriel Risk, San Francisco, CA (US)

(73) Assignee: Silicon Light Machines Corporation, Sunnyvale, CA (US)

( * ) Notice: Subject to any disclaimer, the term of this patent is extended or adjusted under 35 U.S.C. 154(b) by 35 days.

(21) Appl. No.: 10/113,825

(22) Filed: Mar. 29, 2002

(51) Int. Cl.$^7$ .............................................. C30B 31/08
(52) U.S. Cl. ......................................................... 117/2
(58) Field of Search ........................ 117/2, 3; 423/593, 423/598; 252/62.9 R

(56) References Cited

U.S. PATENT DOCUMENTS

| 4,071,323 A | 1/1978 | Holman |
| 4,071,396 A | 1/1978 | Holman |
| 4,196,963 A | 4/1980 | Chen et al. |
| 4,725,330 A | 2/1988 | Holmes et al. |
| 5,204,314 A | 4/1993 | Kirlin et al. |
| 5,726,480 A | 3/1998 | Pister |
| 6,195,197 B1 | 2/2001 | Gopalan et al. |
| 6,211,999 B1 | 4/2001 | Gopalan et al. |
| 6,319,430 B1 | 11/2001 | Bordui et al. |
| 6,652,644 B1 * | 11/2003 | Miller et al. ................... 117/2 |

OTHER PUBLICATIONS

Robert L. Holman and Richard M. Fulrath, "Intrinsic nonstoichiometry in the lead zirconate–lead titanate system determined by Knudsen effusion", Appl. Physics, pp. 5227–5236, vol. 44, No. 12, Dec. 1973; University of California, Berkeley, California.

Robert L. Holman, "Novel uses of the thermo–microbalance in the determination of nonstoichiometry in complex oxide systems", J. Vac. Sci. Technology, pp. 434–439, vol. 11, No. 1, Jan./Feb. 1974; Xerox Rochester Research Center, Rochester, New York.

T.R. Ranganath and S. Wang, "Suppression of Li2O out–diffusion from Ti–diffused LiNbO3 optical waveguides", Appl Physics Letter, pp. 376–379, vol. 30, No. 8, Apr. 15, 1977; University of California, Berkeley, California.

(Continued)

*Primary Examiner*—Nadine G. Norton
*Assistant Examiner*—Matthew Anderson
(74) *Attorney, Agent, or Firm*—Okamoto & Benedicto LLP

(57) ABSTRACT

In one embodiment, lithium oxide concentration in wafers is adjusted by placing the wafers in a vessel. Vapor of a lithium oxide source is provided and absorbed by the wafers, thereby adjusting the lithium oxide concentration in the wafers. In another embodiment, a two-phase lithium-rich source is placed between wafers such that space in the process chamber is efficiently utilized. In another embodiment, the wafers to be processed are placed in a section of a process chamber (e.g., process tube). Lithium oxide is introduced on end of the process chamber. Carrier gas is also introduced on that end of the process chamber to carry the lithium oxide into the section of the process chamber where the wafers are located. By adjusting the partial pressure of lithium oxide in the process chamber, the rate at which lithium oxide is absorbed by the wafers is controlled.

12 Claims, 17 Drawing Sheets

OTHER PUBLICATIONS

Shintaro Miyazawa, et al., "A simple technique for suppressing Li2O out–diffusion in Ti:LiNbO3 optical waveguide", Appl Physics Letter, pp. 742–744, vol. 31, No. 11, Dec. 1, 1977; Paris, France.

R. L. Holman, et al., "Chemical control of optical damage in lithium niobate", Appl. Physics Letter, pp. 280–283, vol. 32, No. 5, Mar. 1, 1978; Webster Research Center, Xerox Corp., Rochester, New York.

Bor–Uei Chen and Antonio C. Pastor, "Elimination of Li2O out–diffusion waveguide in LiNbO3 and LiTaO3", Appl Physics Letters, pp. 570–571, vol. 30, No. 11, Jun. 1, 1977; Hughes Research Laboratories, Malibu, California.

V. Ya Shur, et al., "Polarization reversal in congruent and stoichiometric lithium tantalite", total pp. 3,; Institute of Physics and Appl Mathematics, Ural State University, Russia; National Institute for Research in Inorganic Material, Tsukuba, Japan.

Kenji Kitamura, et al., "Crytal growth and low coercive field 180 degrees domain switching characteristics of stoichiometric LiTaO3", Appl Physics Letters, pp. 3073–3075, vol. 73, No. 21, Nov. 23, 1998; Nat'l Institute for Research in Inorganic Materials, Tsukuba, Japan; NGK Spark Plug Co., Komaki, Japan; Center for Materials Science, Los Alamos Nat'l Laboratories, New Mexico.

* cited by examiner

METHOD AND APPARATUS FOR ADJUSTING LITHIUM OXIDE CONCENTRATION IN WAFERS

REFERENCE TO RELATED APPLICATIONS

The present application is related to the following commonly-owned disclosures, which are incorporated herein by reference in their entirety:

(a) U.S. application Ser. No. 10/113,377, filed Mar. 29, 2002, now U.S. Pat. No. 6,652,644, entitled "ADJUSTING LITHIUM OXIDE CONCENTRATION IN WAFERS USING A TWO-PHASE LITHIUM-RICH SOURCE," filed by Gregory D. Miller and Janos Lazar on the same day as the present application; and (b) U.S. application Ser. No. 10/113,876, filed Mar. 29, 2002, pending, entitled "CONTROLLED PARTIAL PRESSURE TECHNIQUE FOR ADJUSTING LITHIUM OXIDE CONCENTRATION IN WAFERS," filed by Gregory D. Miller on the same day as the present application.

BACKGROUND OF THE INVENTION

1. Field of the Invention

The present invention relates generally to wafer processing, and more particularly to methods and apparatus for adjusting the lithium oxide concentration in wafers.

2. Description of the Background Art

Lithium tantalate ($LiTaO_3$) and lithium niobate ($LiNbO_3$) are widely used materials for fabricating nonlinear optical devices because of their relatively large electro-optic and nonlinear optical coefficients. These nonlinear optical devices include wavelength converters, amplifiers, tunable sources, dispersion compensators, and optical gated mixers, for example.

Stoichiometric lithium tantalate (SLT) and congruent grown lithium tantalate (CLT) are two types of lithium tantalate wafers. An example of a lithium niobate wafer is the so-called congruent grown lithium niobate (CGN). It has been shown that SLT has better lifetime and ferroelectric properties than CLT and CGN in nonlinear optical devices; e.g., see "Crystal Growth and Low Coercive Field 180° Domain Switching Characteristics Of Stoichiometric $LiTaO_3$," Applied Physics Letters, Nov. 23, 1998, Vol. 73, Number 21, by K. Kitamura et al. However, although SLT has desirable properties, SLT wafers are relatively difficult to obtain. In contrast, CLT wafers are produced in large quantities by commercial suppliers and are thus widely available.

One way of fabricating SLT wafers is by the vapor transport equilibration method described in U.S. Pat. Nos. 4,071,396 and 4,071,323, which are both issued to Robert L. Holman ("Holman"). U.S. Pat. Nos. 4,071,396 and 4,071,323 are incorporated herein by reference in their entirety. In Holman, a target wafer is exposed to lithium oxide ($Li_2O$) vapor produced by heating a mass of a lithium-rich two-phase powder. The two-phase powder produces a constant vapor pressure of lithium oxide equal to the vapor pressure of stoichiometric lithium tantalate. The wafer, which is initially deficient in lithium oxide, absorbs lithium oxide from the vapor until it reaches the stoichiometric composition (i.e., lithium oxide concentration of 50 mol %, tantalum pentoxide concentration of 50 mol %). At that point, the vapor pressure of stoichiometric lithium tantalate over the surface of the wafer equals the vapor pressure of the surrounding lithium oxide, thereby reaching a process equilibrium and stopping the diffusion of lithium oxide into the wafer.

The aforementioned Holman process has several disadvantages. One disadvantage is that the volume of the two-phase lithium-rich powder may be greater than that of the target wafer. This may limit the throughput of commercially available furnaces for performing the process in that there will be less available process tube flat zone left available for wafers. Another disadvantage is that the wafers are placed in close proximity to a large amount of crumbly two-phase lithium-rich powder, increasing the potential for surface contamination. Still another disadvantage of the Holman process is that it requires a space-inefficient containment vessel to eliminate pressure gradients. Yet another disadvantage of the Holman process is that it restricts the resulting lithium oxide concentration in the wafer to be that of stoichiometric lithium tantalate. Although there are applications where a stoichiometric composition is desirable, the Holman process cannot be used in other applications where the lithium oxide concentration in the wafer is preferably below 50 mol %.

SLT wafers can also be fabricated using the double-crucible Czochralski (DCC) growth method. In the DCC growth method, a boule of lithium tantalate is pulled from a melt in the center crucible of a concentric crucible pair. The lithium oxide concentration in the melt is chosen such that the initially grown material is of the stoichiometric composition. As the boule grows and is pulled from the melt, a stoichiometric mixture of lithium oxide and tantalum pentoxide ($Ta_2O_5$) powder is poured into the outer crucible at a rate carefully controlled to equal the rate of crystal growth.

Crystal growth rate using the DCC growth method is a fraction of the growth rate achievable using congruent growth methods. Thus, SLT wafers fabricated using the DCC growth method are not as cost effective as CLT wafers. Also, in the DCC growth method, striations in the resulting wafers are difficult to suppress, causing variations in optical properties from wafer to wafer.

Another way of fabricating SLT wafers is by the Czochralski growth from a lithium-rich melt (LRM) method. In the LRM growth method, only a fraction (e.g., approximately 10%) of the melt is used to produce the stoichiometric boule. Because continued growth after using the fraction of the melt results in rapid deviation from the stoichiometric composition, the melt is frequently recycled. Tantalum pentoxide powder is added to the recycled melt to achieve the appropriate lithium oxide to tantalum pentoxide concentration for the next growth run.

The LRM growth method grows material at a slower rate than congruent growth methods, and has the additional throughput reduction associated with the time required to recycle the used melt. Further, because accurate measurement of lithium oxide concentration in a used melt is difficult, approximations are made to determine the lithium oxide concentration in the melt. This results in variations in the amount of useful grown material from boule to boule.

From the foregoing, an improved technique for adjusting the lithium oxide concentration in wafers is highly desirable. Ideally, such a technique should also allow production of SLT wafers in large quantities and at a relatively low cost.

SUMMARY

The present invention relates to an improved technique for adjusting the lithium oxide concentration in wafers. In one embodiment, the lithium oxide concentration is adjusted to stoichiometric concentration. In other embodiments, the lithium oxide concentration is adjusted to a value below stoichiometric concentration.

In one embodiment, the present invention is employed to adjust the lithium oxide concentration in CLT wafers to stoichiometric concentration, thereby converting the CLT wafers to SLT wafers. As can be appreciated, using generally available CLT wafers to create SLT wafers results in manufacturing cost savings. Further, using the teachings of the present invention, SLT wafers can be fabricated from CLT wafers in relatively large quantities.

In one embodiment, a lithium oxide source is placed in a vessel along with wafers to be processed. The vessel is heated to transform the lithium oxide source into vapor, which is then absorbed by the wafers. In one embodiment, the lithium oxide source includes lithium oxide powder.

In one embodiment, the vessel is a sealed vessel and components within the vessel are resistant to lithium oxide. Thus, when the vessel is heated, all of the created lithium oxide vapor is absorbed by the wafers. The resulting lithium oxide concentration in the wafers can be adjusted by controlling the amount of lithium oxide placed in the vessel. In other embodiments, the vessel is a leaky vessel. In those embodiments, excess lithium oxide source is placed in the vessel to compensate for the leak.

In one embodiment, a two-phase lithium-rich source (e.g., two-phase lithium tantalate powder) source is placed between wafers such that space in the process chamber is efficiently utilized.

In one embodiment, the wafers to be processed are placed in a section of a process chamber (e.g., process tube). Lithium oxide is introduced on one end of the process chamber. Carrier gas is also introduced on that end of the process chamber to carry the lithium oxide into the section of the process chamber where the wafers are located. By adjusting the partial pressure of lithium oxide in the process chamber, the rate at which lithium oxide is absorbed by the wafers is controlled.

These and other features and advantages of the present invention will be readily apparent to persons of ordinary skill in the art upon reading the entirety of this disclosure, which includes the accompanying drawings and claims.

The use of the same reference label in different drawings indicates the same or like components. Unless otherwise noted, the aforementioned drawings are not drawn to scale.

DETAILED DESCRIPTION

In the present disclosure, numerous specific details are provided, such as examples of apparatus and/or methods, to provide a thorough understanding of embodiments of the invention. One skilled in the relevant art will recognize, however, that the invention can be practiced without one or more of the specific details, or with other apparatus, systems, methods, components, materials, parts, and/or the like. In other instances, well-known structures, materials, or operations are not shown or described in detail to avoid obscuring aspects of the invention.

Figure 1:
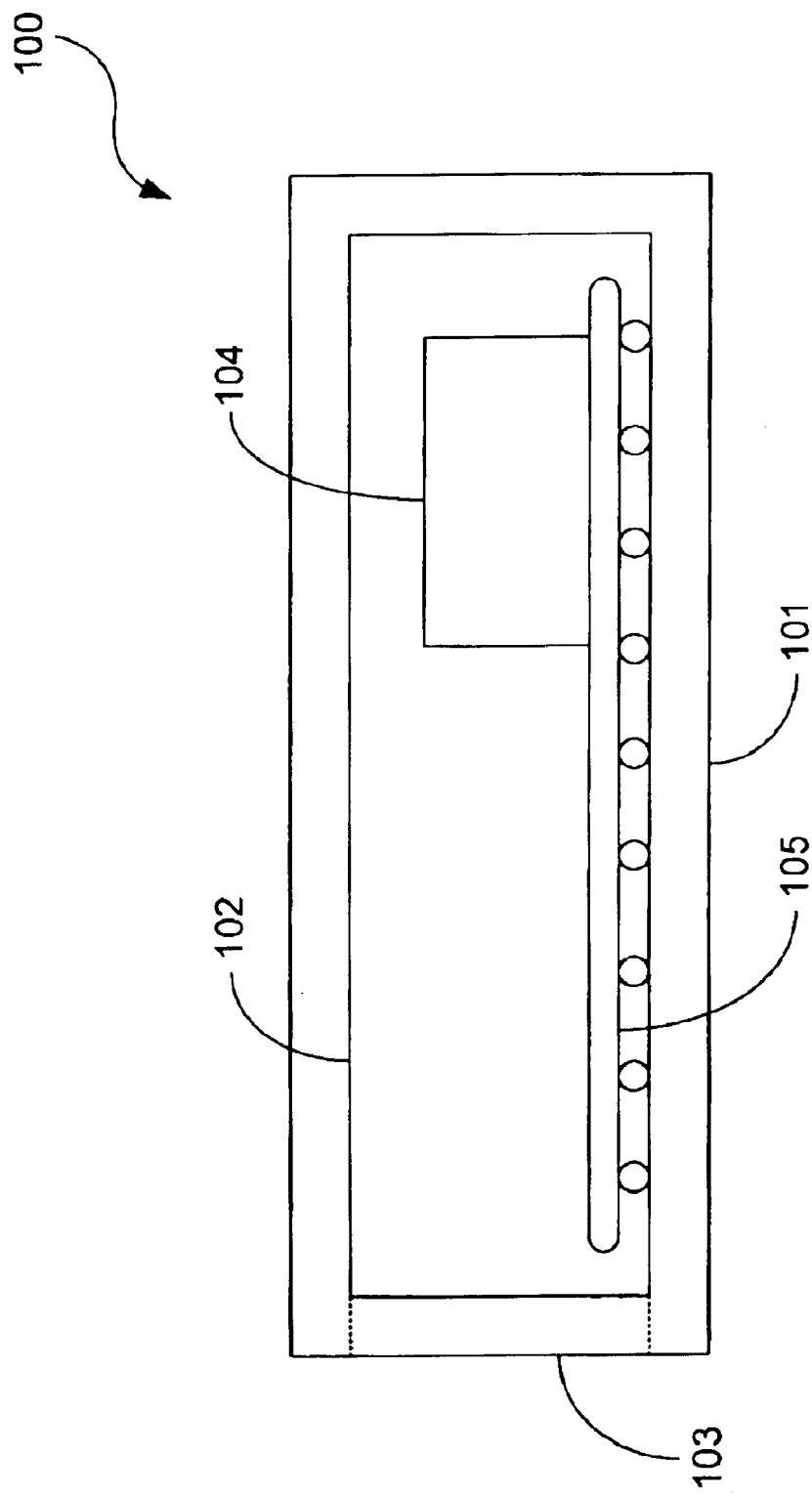
FIG. 1 shows a schematic diagram of a process environment in accordance with an embodiment of the present invention.

Referring now to FIG. 1, there is shown a schematic diagram of a process environment 100 in accordance with an embodiment of the present invention. As shown in FIG. 1, a vessel 104 is placed inside process tube 102 of a furnace 101. One or more vessels 104 may be used depending on the size of furnace 101 and the dimensions of each vessel. Specific implementations of vessel 104 include vessels 104A, 104B, 104C, 104D, and 604, all of which are described later on below.

Vessel 104 is moved in and out of process tube 102 using a boat 105, which enters the furnace through opening 103. During wafer processing, heating elements (not shown) surrounding process tube 102 are energized to raise the temperature inside process tube 102 and thereby heat vessel 104. As can be appreciated, the just described process environment is exemplary; other techniques for heating vessel 104 may also be used without detracting from the merits of the present invention. For example, the use of a process tube is not specifically required because other heated process chambers may also be used.

Figures 2A, 2B:
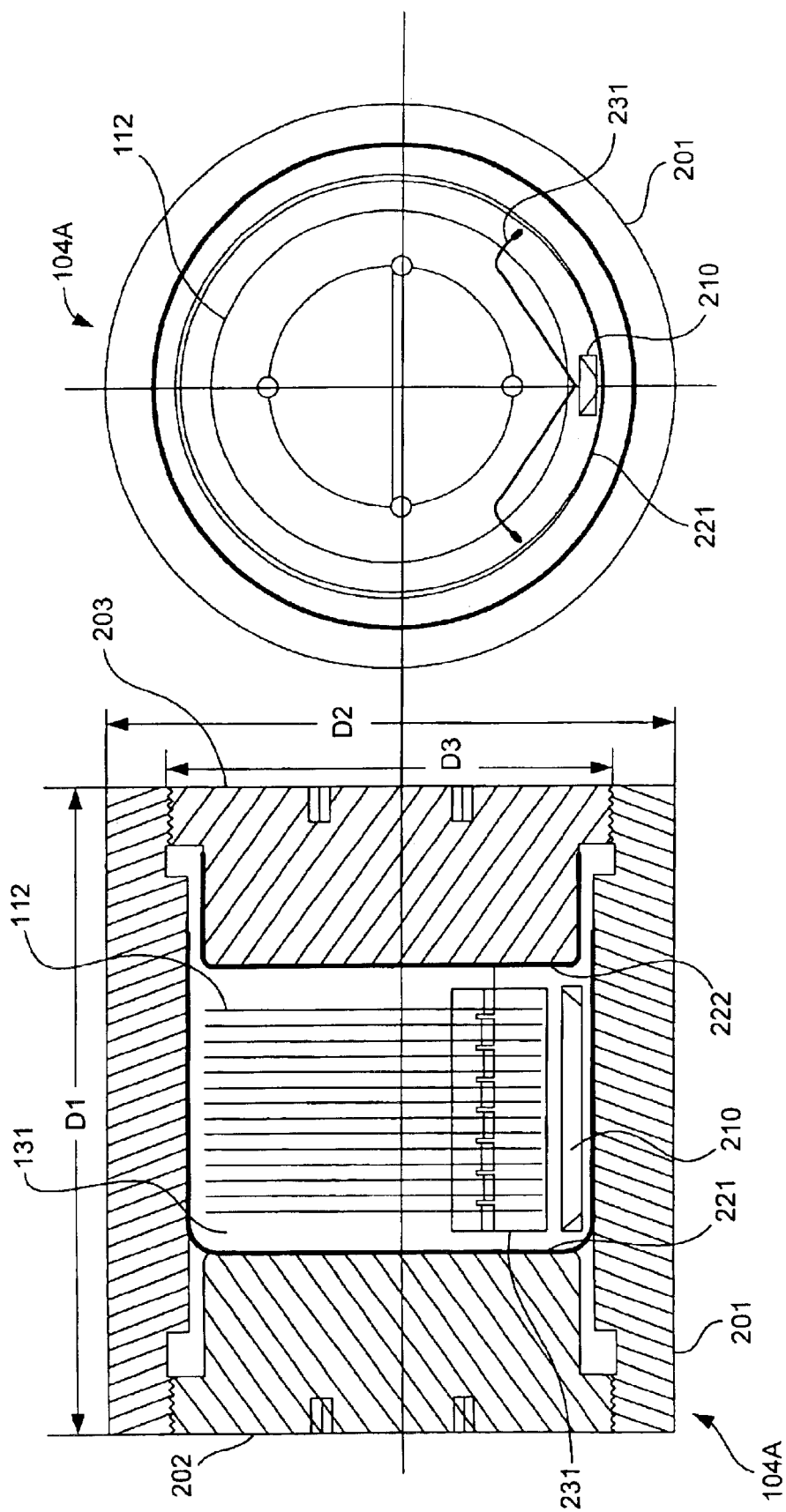
FIGS. 2A and 2B show a side cross-sectional view and a front x-ray view, respectively, of a vessel in accordance with an embodiment of the present invention.

FIGS. 2A and 2B show a side cross-sectional view and a front x-ray view, respectively, of a vessel 104A in accordance with an embodiment of the present invention. As mentioned, vessel 104A is a specific embodiment of vessel 104 shown in FIG. 1. Vessel 104A includes a housing 201, which is sealed by a cap 202 on one end and by a cap 203 on the other end. Caps 202 and 203 are threaded onto housing 201. In one embodiment, vessel 104A has a dimension D1 of 6.750 inches, a dimension D2 of 6.000 inches, and a dimension D3 of 5.250 inches.

Housing 201, cap 202, and cap 203 provide mechanical containment of an ampoule 221, which may otherwise expand and potentially rupture due to the expansion of contained gases at elevated temperatures.

Vessel 104A further includes an ampoule 221 which is sealed by a cap 222. In one embodiment, cap 222 is welded onto ampoule 221 prior to wafer processing to provide a hermetic seal, thereby preventing vapor from escaping out of ampoule 221. Arc welding or TIG welding may be employed to seal the ampoule. After wafer processing, the welding beads attaching cap 222 to ampoule 221 are cut to allow the two components to be separated.

Each wafer to be processed, such as a wafer 112, is placed on a slot of wafer carrier 231. Wafer carrier 231 holds the wafers inside ampoule 221 during wafer processing. In this embodiment, vessel 104A has the capacity to process fourteen 4-inch diameter wafers at a time. As can be appreciated, vessel 104A may be extended to accommodate additional wafers; enlarging vessel 104A allows it to accommodate larger wafers. It is estimated that vessel 104A, and other vessels in the present disclosure, may be scaled to accommodate around 300 wafers at a time. This is in marked contrast to other types of vessels that can only process a few wafers at a time.

Still referring to FIGS. 2A and 2B, a box 210 for holding a lithium oxide source (e.g., lithium oxide powder) is placed inside ampoule 221. Box 210 is placed underneath the wafers in this embodiment. When vessel 104A is heated, lithium oxide vapor from the lithium oxide source escapes from the top portion of box 210 and into the surrounding volume 131.

Ampoule 221, cap 222, and all components within volume 131 such as box 210 and carrier 231 (collectively "ampoule components") are preferably made of material that will not absorb lithium oxide. This helps ensure that all of the lithium oxide source in box 210 is converted to vapor and absorbed by the wafers inside volume 131. Because vessel 104A is sealed, the wafers all achieve the same end-point vapor pressure, thereby allowing the wafers to have similar lithium oxide concentration.

In one embodiment, a platinum-iridium alloy is the preferred material for making ampoule components. Other materials that may be used for fabricating ampoule components include, without limitation, platinum and iridium. The platinum in the platinum-iridium alloy prevents absorption of lithium oxide, while the iridium in the alloy retards the growth of grain boundaries at high temperatures. As can be appreciated, grain boundaries are potential leakage paths and are thus advantageously minimized. To further prevent the development of leakage paths, ampoule 221 and cap 222 have sufficient wall thickness, which in one embodiment is about 0.05 inch.

Because platinum reacts violently with silicon carbide, a material commonly used in furnaces, the outer surfaces of vessel 104A such as housing 201, cap 202, and cap 203 are preferably made of a heat resistant material other than platinum. In one embodiment, the outer surfaces of vessel 104A are made of alumina. Of course, other materials may also be used (including platinum) depending on the specific furnace employed.

Figure 3:
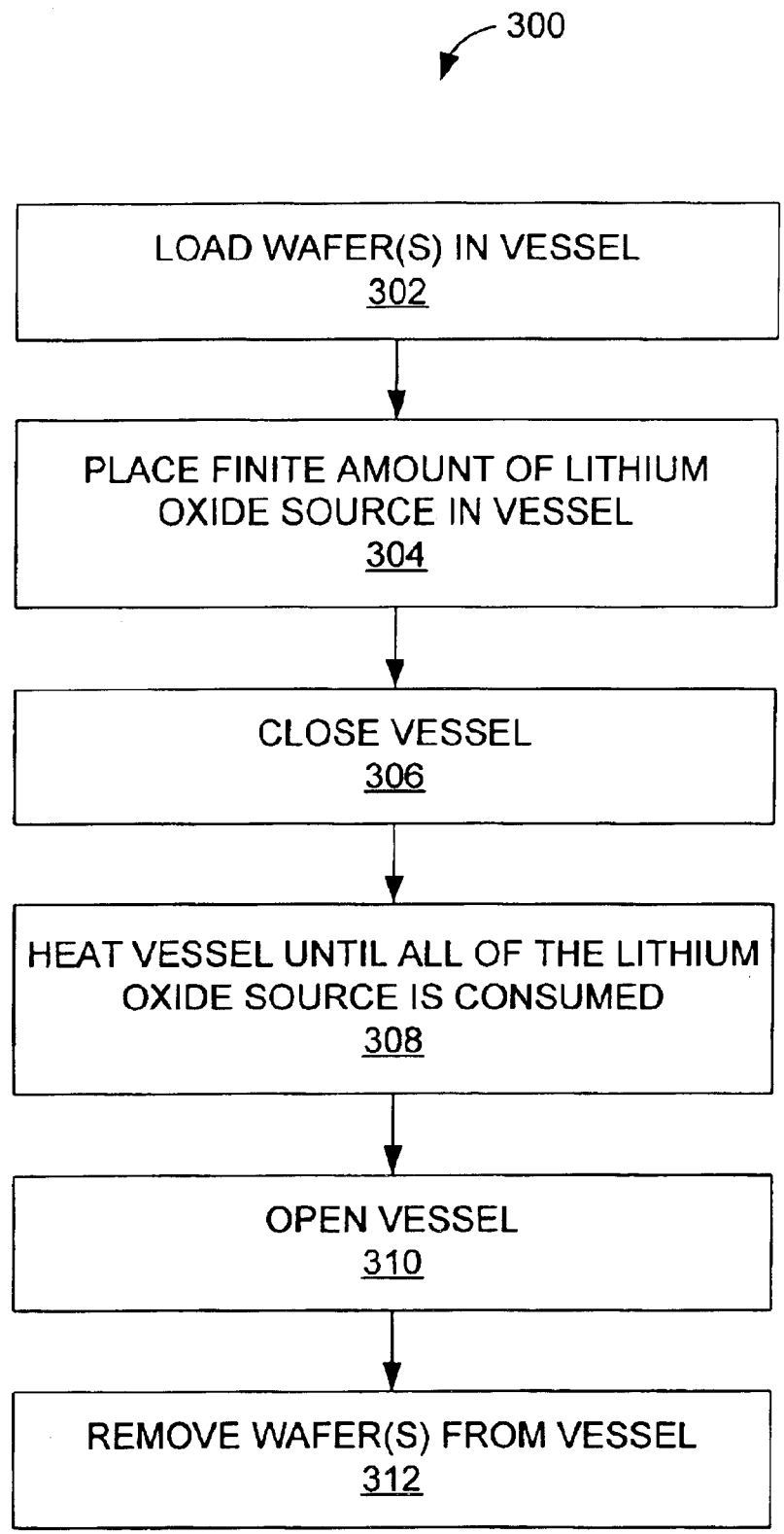
FIG. 3 shows a flow diagram of a process for adjusting the lithium oxide concentration in a wafer in accordance with an embodiment of the present invention.

FIG. 3 shows a flow diagram of a process 300 for adjusting the lithium oxide concentration in a wafer in accordance with an embodiment of the present invention. Process 300 is described in conjunction with vessel 104A; however, process 300 may also be performed using other types of vessels.

In action 302, wafers (or a single wafer) are placed inside vessel 104A. In one embodiment, the wafers are unpolished CLT wafers such as those commercially available from Shin-Etsu Chemical, Inc. of Japan and Yamaju, Inc. also of Japan. The initial lithium oxide concentration in each wafer will vary depending on the manufacturer of the wafer. For example, each CLT wafer may have a lithium oxide concentration of approximately 48.5 mol % and a tantalum pentoxide concentration of approximately 51.5 mol %. Wafers with different lithium oxide concentration may also be used because, as discussed below, lithium oxide concentration can be adjusted using the teachings of the present invention.

In action 304, a finite amount of lithium oxide source is placed in box 210 of vessel 104A (see FIG. 2A). In this embodiment, the lithium oxide source includes lithium oxide powder. Lithium oxide powder is commercially available from various companies including VWR International. Lithium oxide powder is not as bulky as two-phase lithium-rich powders (e.g., two-phase lithium niobate powder, two-phase lithium tantalate powder), thereby allowing for more wafer space inside the vessel and improving throughput. Because lithium oxide powder readily absorbs moisture, action 304 is preferably performed in a dry environment.

The amount of lithium oxide powder inside vessel 104A dictates the lithium oxide concentration in the resulting wafers. That is, the lithium oxide concentration in the wafers may be adjusted to stoichiometric concentration or some other concentration by adjusting the amount of lithium oxide powder in the vessel. A microbalance, for example, may be used to weigh a precise amount of lithium oxide powder. Because vessel 104A is designed to be leak-free and the ampoule materials do not absorb lithium oxide, all lithium oxide powder that is subsequently converted to vapor is absorbed by the wafers inside the vessel. Thus, a mass calculation may be performed to determine the amount of lithium oxide powder required to achieve a specific lithium oxide concentration in the wafers. Experimental methods may also be used. For example, several wafer processing runs using various amounts of lithium oxide powder may be performed; the lithium oxide concentration of the resulting wafers can then be measured and correlated with the amount of lithium oxide powder used.

By adjusting the amount of lithium oxide powder used, the lithium oxide concentration in wafers may be adjusted to a value between that of congruent composition and that of stoichiometric composition. In the event that more than enough lithium oxide powder is used, the excess lithium oxide powder results in a wafer whose surface consists of a mixture of the stoichiometric and lithium-rich phases. However, the inner volume of the wafer remains stoichiometric, and the wafer may be polished to produce a stoichiometric wafer.

One way of measuring the lithium oxide concentration in a wafer is by measuring its Curie temperature. Generally speaking, the Curie temperature of a material is the temperature beyond which the material loses its ferroelectric properties. Curie temperatures can be measured using various known techniques including by differential scanning calorimeter and electronic tests. The Curie temperature of a wafer is indicative of its lithium oxide-tantalum pentoxide ratio. For example, experimental results indicate that a CLT wafer having a lithium oxide concentration of 48.5 mol % has a Curie temperature of around 595° C. to 605° C. An SLT wafer having a lithium oxide concentration of 50 mol % has a Curie temperature of around 695° C.

In one embodiment, SLT wafers are created by adjusting the lithium oxide concentration in CLT wafers placed in vessel 104A. This is done by using an amount of lithium oxide powder that is sufficient to change the lithium oxide concentration in the CLT wafers to 50 mol %. As can be appreciated, using widely available CLT wafers to fabricate SLT wafers results in manufacturing cost savings. Further, using the teachings of the present invention, SLT wafers can be fabricated from CLT wafers in relatively large quantities.

Other lithium oxide concentrations (e.g., 49.5 mol %) are also possible by adjusting the amount of lithium oxide powder in vessel 104A.

Continuing with action 306, vessel 104A is closed after the lithium oxide powder and wafers are placed therein. In this embodiment, vessel 104A is hermetically sealed by arc welding cap 222 onto ampoule 221. Note that in embodiments employing other vessels, the vessel may or may not be hermetically sealed.

In action 308, vessel 104A is heated in a furnace until all of the lithium oxide powder is consumed. As can be appreciated, this allows for a simple and repeatable endpoint because the wafers stop absorbing lithium oxide after all of the lithium oxide powder is converted into vapor and absorbed by the wafers. Extending the process time past the point where all of the lithium oxide powder is consumed, within reason, does not affect the resulting lithium oxide concentration in the wafers.

In this embodiment, vessel 104A is heated to a temperature high enough to vaporize lithium oxide powder (e.g., above 660° C.). It is estimated that it would take approximately 100 hours to heat a vessel 104A, at a nominal furnace temperature of 1350° C., to turn CLT wafers into SLT wafers. The nominal pressure inside vessel 104A during that time is estimated to be around 5 atm to 6 atm. The pressure inside the vessel is primarily due to expansion of air trapped in the vessel when it was hermetically sealed. Of course, specific process parameters such as processing time, heating temperature, and the amount of lithium oxide powder would vary depending on implementation.

In action 310, vessel 104A is opened after wafer processing. In this embodiment, vessel 104A is opened by cutting the beads of the weld used to attach cap 222 on ampoule 221. In action 312, the processed wafers (which now have the desired lithium oxide concentration) are removed from vessel 104A. The wafers may then be polished in a subsequent polishing operation.

In one experiment using the just described process 300, CLT wafers whose lithium oxide concentration was originally 48.5 mol % exhibited Curie temperatures above 695° C. and coercive fields in the range of 100–200 V/mm after processing. The relatively high Curie temperature and relatively low coercive fields indicate that the resulting wafers have the desired near stoichiometric composition. As can be appreciated, process 300 may be fine tuned to achieve optimum results.

Figure 4:
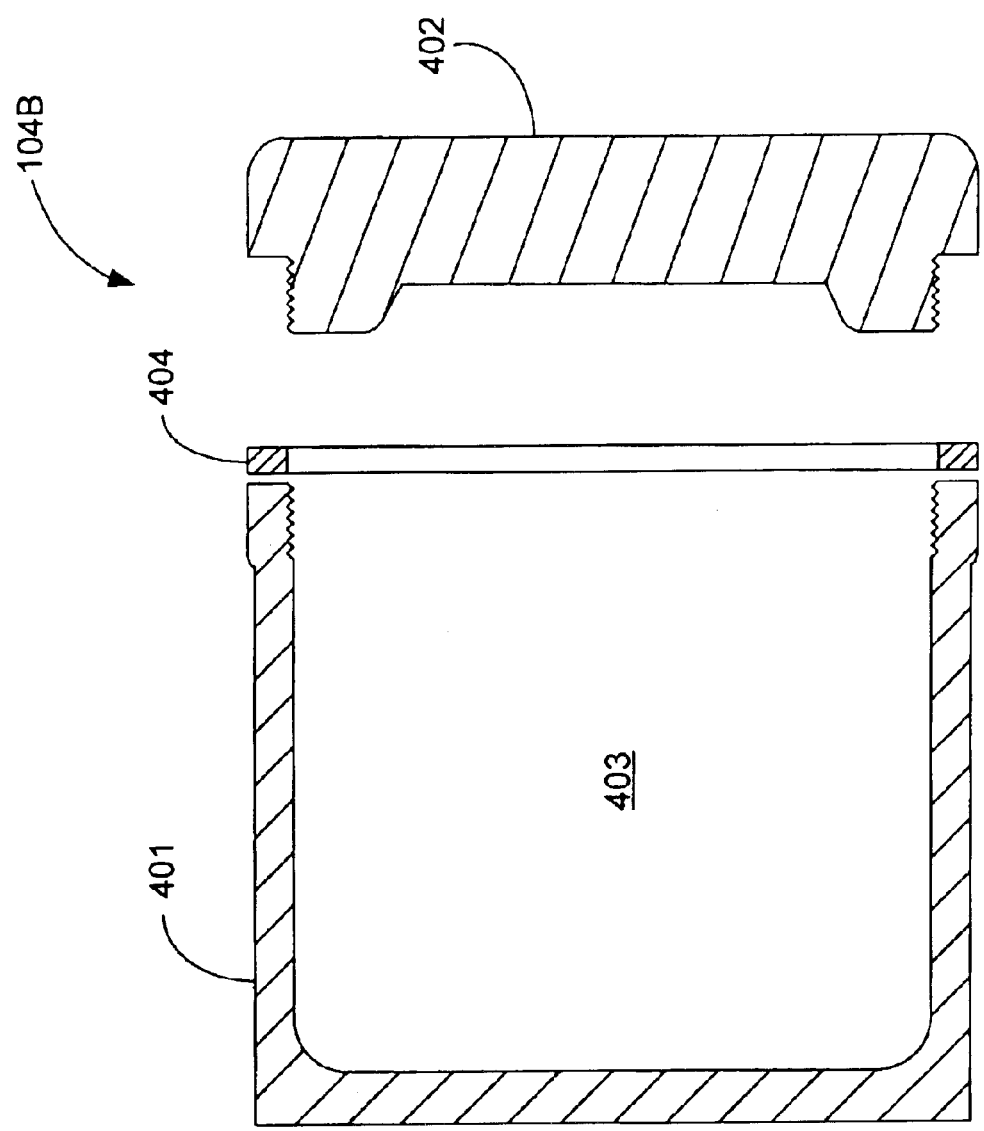
FIG. 4 shows a side cross-sectional view of a vessel in accordance with an embodiment of the present invention.

In another embodiment of the present invention, a highly reusable vessel 104B is employed in process 300 in lieu of vessel 104A. FIG. 4 shows a side cross-sectional view of such a vessel 104B in one embodiment. Vessel 104B includes a housing 401 and a cap 402. Cap 402 is threaded onto housing 401 to create a hermetically sealed volume 403. Unlike vessel 104A, vessel 104B does not include an internal ampoule. Hermetic sealing is achieved in vessel 104B by using a high temperature gasket 404 between housing 401 and cap 402. Gasket 404 may be made of alumina, for example. At high temperatures, a gasket 404 of alumina expands to seal the interface between housing 401 and cap 402. As can be appreciated, vessel 104B is a highly reusable vessel in that welding and cutting are not required to create a hermetic seal.

In one embodiment, housing 401 and cap 402 are made of silicon carbide. Silicon carbide is a preferred material for vessel 104B because it can be used at very high temperatures and does not absorb lithium oxide. Additionally, adjoining silicon carbide components (e.g., housing 401 and cap 402) do not permanently bond together even when exposed to very high temperatures.

A wafer carrier such as wafer carrier 231 may be used to hold wafers inside vessel 104B. A box (e.g., box 210) containing a desired amount of lithium oxide powder may be placed under the wafer carrier as in vessel 104A.

In another embodiment, a leaky vessel 104C (not shown) is employed in process 300 in lieu of vessel 104A. Unlike vessel 104A and vessel 104B, vessel 104C does not maintain a hermetic seal. A vessel 104C may be constructed using a vessel 104B without gasket material. A vessel 104C may also be constructed using a vessel 104A without a hermetically sealed ampoule (e.g., by not welding cap 222 onto ampoule 221). Other vessels with designed-in or unintentional leaks may also be used, so long as the leak is characterized and compensated for as described below.

When using a vessel 104C in process 300, excess lithium dioxide powder is provided to overcompensate for the leak. The amount of lithium dioxide powder needed to achieve a desired lithium oxide concentration depends on the size of the leak and the total process time. As long as there is more than enough lithium oxide powder in vessel 104C to achieve a stoichiometric composition, the resulting wafer would still have a lithium oxide concentration of around 50 mol %. The inventors believe that this is because the excess lithium oxide is trapped near the surface of the wafer, leaving the bulk of the wafer stoichiometric. The excess lithium oxide on the surface of the wafer can be removed in subsequent polishing operations.

When using a leaky vessel such as vessel 104C in process 300, the leaky vessel is heated for an amount of time sufficient to achieve stoichiometric composition. Because there is an excess amount of lithium oxide powder in the leaky vessel to compensate for the leak, process 300 may be terminated before the entirety of the lithium oxide powder is consumed. The amount of time sufficient to achieve stoichiometric composition may be calculated or empirically determined.

In another embodiment, a vessel 104D, which is designed to leak at low temperatures and to seal at high temperatures, is employed in process 300 in lieu of vessel 104A. At temperatures too low to transform lithium oxide powder into vapor, vessel 104D leaks to allow air to escape out, thereby lowering the pressure inside the vessel. At temperatures high enough to vaporize lithium oxide powder (e.g., at wafer processing temperature), vessel 104D seals to prevent lithium oxide vapor from leaking out of the vessel. As can be appreciated, a vessel 104D operates at lower pressures compared to a vessel 104A. This allows vessel 104D to have thinner walls, which translates to lower weight, thus making vessel 104D easier to handle in a fabrication facility.

Figure 5A:
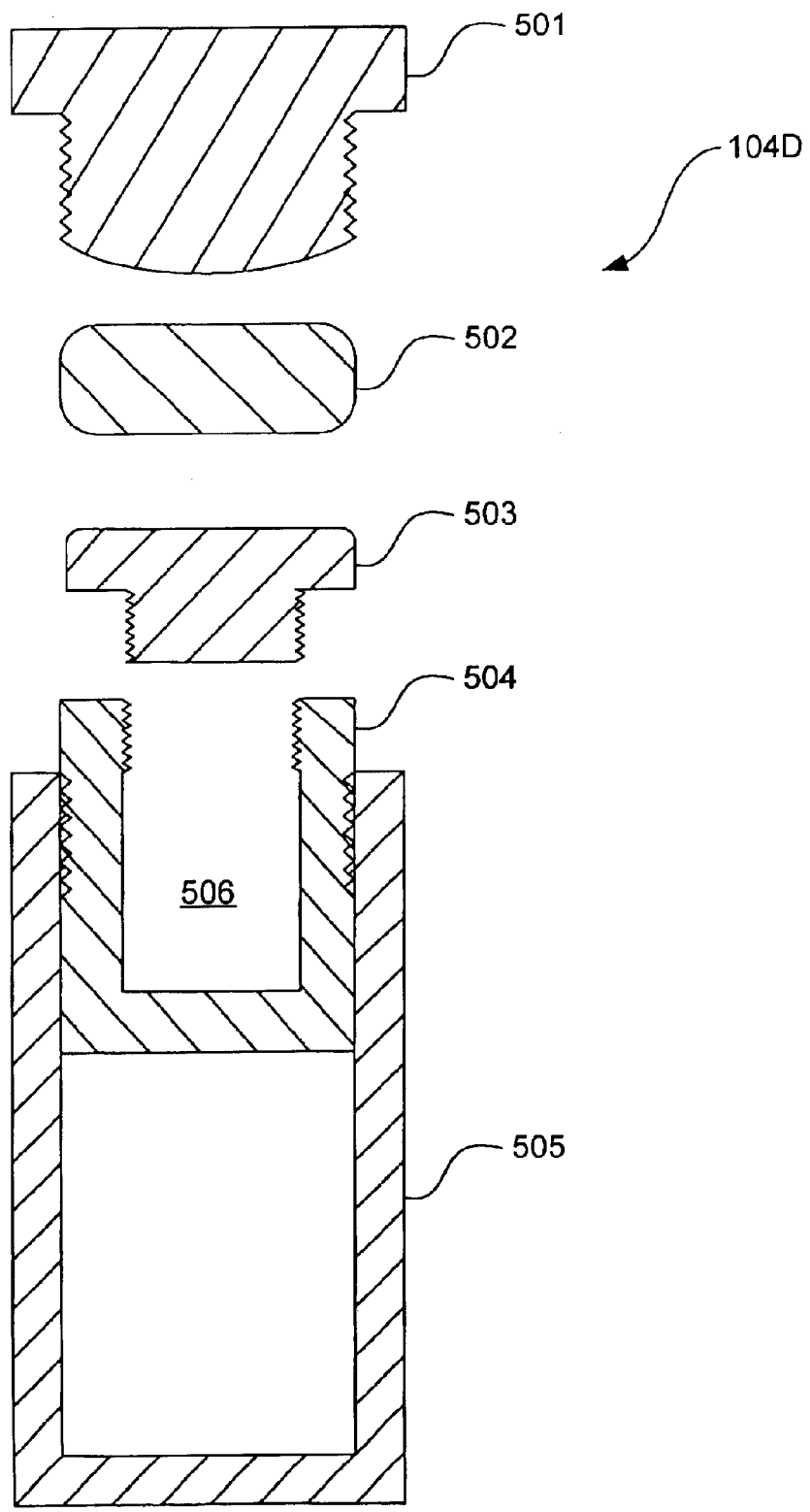
FIGS. 5A and 5B schematically show side cross-sectional views of a vessel in accordance with an embodiment of the present invention.
Figure 5B:
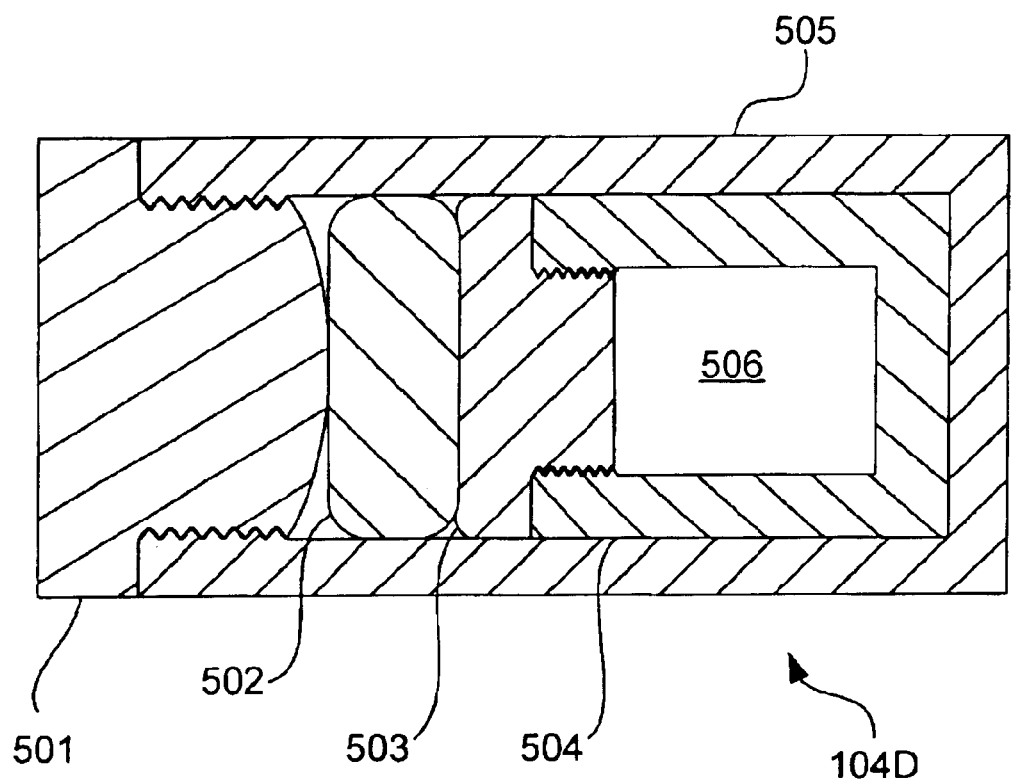

FIG. 5A schematically shows the various components of a vessel 104D in accordance with an embodiment of the present invention. A cap 503 threads onto an ampoule 504 to create a volume 506 where wafers and lithium oxide powder are placed during wafer processing. Ampoule 504 and cap 503 slide into a housing 505. A cap 501 threads onto housing 505 to contain ampoule 504. A spacer 502 is placed between cap 501 and cap 503 to seal volume 506 at high temperatures. FIG. 5B schematically shows vessel 104D as configured for wafer processing. Wafers, a wafer carrier, and a container for holding lithium oxide powder placed in volume 506 during wafer processing are not shown for clarity.

All components of vessel 104D except spacer 502 are preferably made of a heat resistant material that will not absorb lithium oxide. An example of such a material is silicon carbide. Silicon carbide has a relatively low expansion coefficient and will not substantially expand when heated. Spacer 502, on the other hand, is made of a material that will readily expand when exposed to elevated temperatures. In one embodiment, spacer 502 is made of alumina.

At the initial stages of wafer processing when vessel 104D is still at relatively low temperatures, gases in volume 506 will leak through the threads of vessel 104D. As the temperature begins to rise, spacer 502 will expand until it provides a tight seal inside vessel 104D. At that point, volume 506 will be sealed and all of the lithium oxide powder contained therein will be vaporized and absorbed by the wafers. Thus, similar to vessel 104A, vessel 104D may be used to adjust the lithium oxide concentration in wafers by placing a finite amount of lithium oxide powder in volume 506 and thereafter heating the vessel.

Figure 6B:
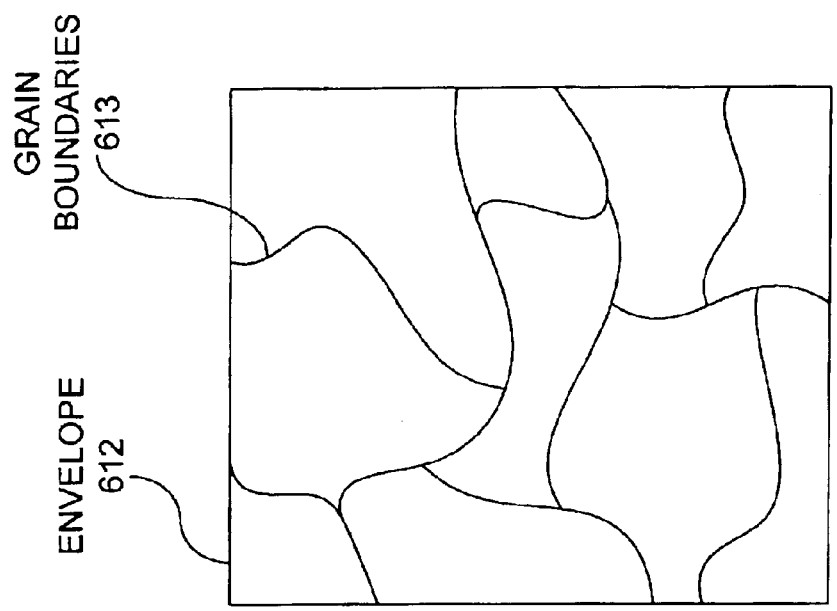
FIGS. 6A–E schematically illustrate various ways of providing lithium oxide vapor in accordance with embodiments of the present invention.
Figure 6A:
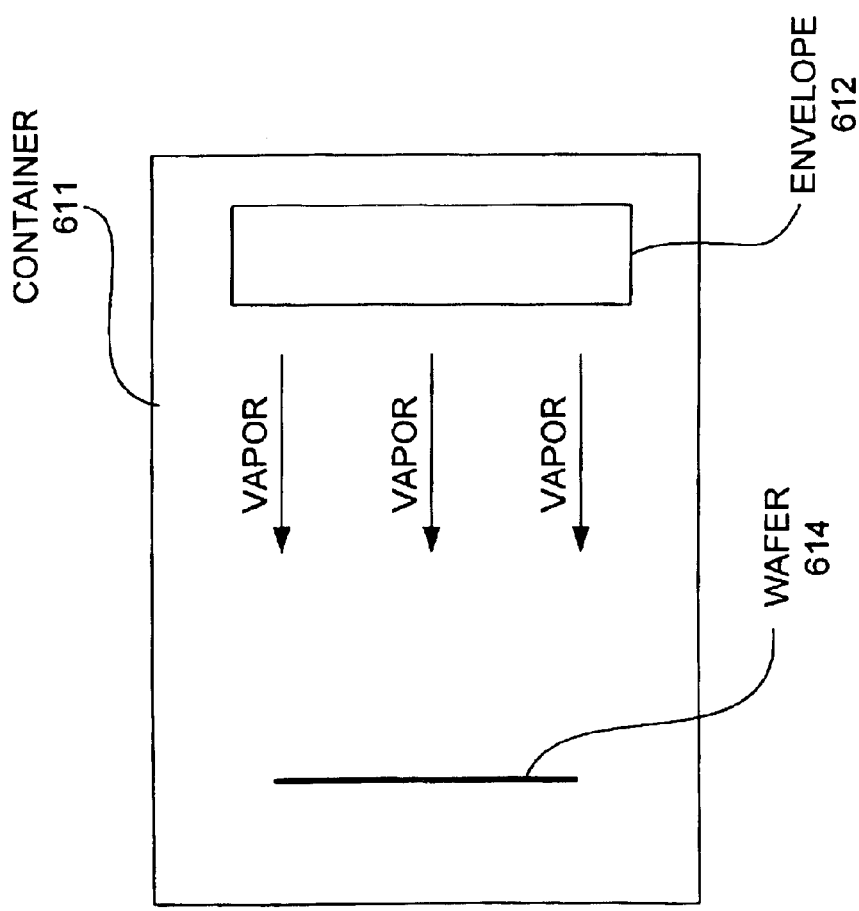
Figure 6D:
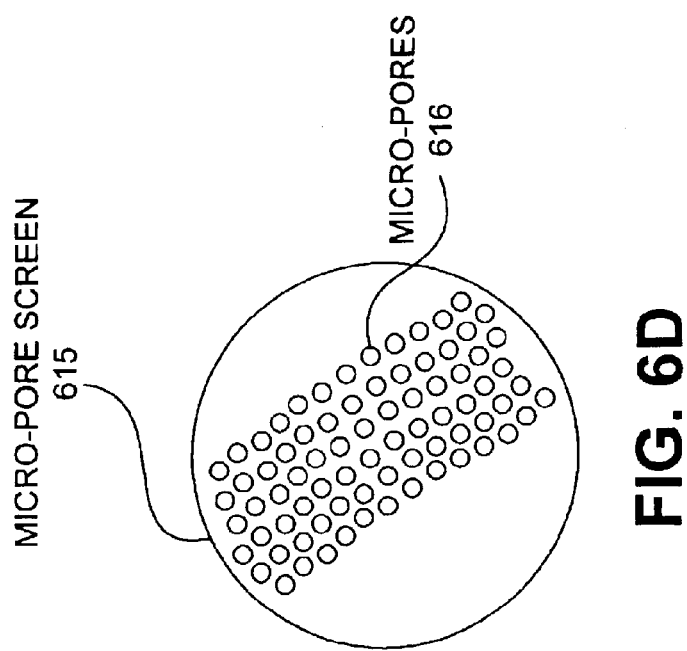

Alternative ways of providing lithium oxide vapor are now described with reference to the schematic diagrams of FIGS. 6A–6E. In FIG. 6A, a container 611 includes an envelope 612. Container 611 may be an ampoule or a reusable vessel containing one or more wafers 614 to be processed, for example. Envelope 612 contains lithium oxide powder and provides a membrane through which only lithium oxide vapor can diffuse. That is, envelope 612 prevents lithium oxide powder from escaping into the volume of container 611. Envelope 612 may be made of platinum or other high temperature material. Referring to FIG. 6B, grain boundaries 613 of a platinum envelope 612 grow when heated to elevated temperatures. When grain boundaries 613 grow to sufficient size, they will allow lithium oxide vapor to diffuse through them. Lithium oxide vapor will continue to diffuse through grain boundaries 613 and reach wafer 614 as long as the vapor pressure inside envelope 612 is greater than the vapor pressure outside envelope 612.

Figure 6C:
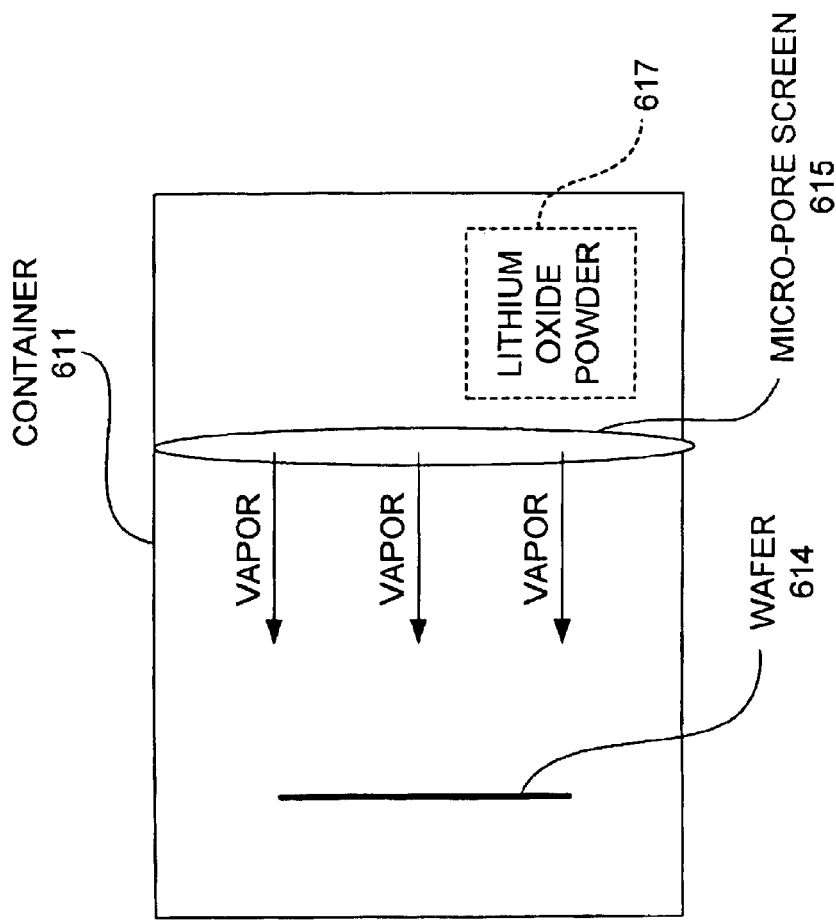

In FIG. 6C, a micro-pore screen 615 is provided between a lithium oxide powder 617 and one or more wafers 614. Micro-pore screen 615 includes many small holes, denoted as micro-pores 616 in FIG. 6D, to allow lithium oxide vapor to pass through while preventing lithium oxide powder from escaping to the wafer side of container 611. Similarly, a screen with a single pinhole may also be used.

Figure 6E:
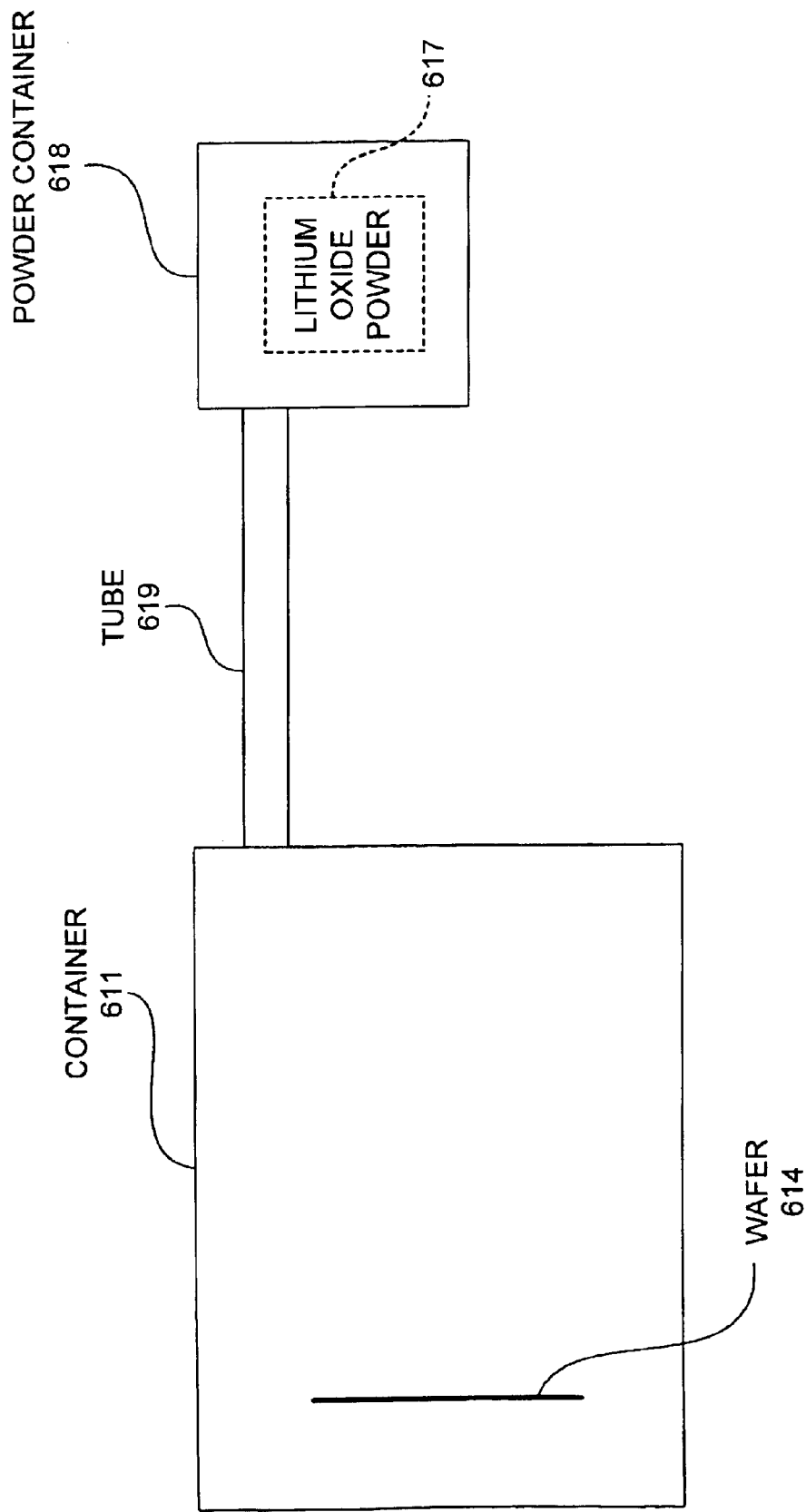

In FIG. 6E, a small-diameter tube 619 is used as the only connecting element between container 611 and a powder container 618. Powder container 618 contains lithium oxide powder 617. The temperature of tube 619 is controlled independent of container 611 and powder container 618. That is, container 611 and powder container 618 are heated separately from tube 619. For example, container 611 and powder container 618 may be heated inside a process chamber, while tube 619 is located outside the process chamber. Cooling and heating mechanisms may be coupled to tube 619. The manner in which the temperatures of container 611, tube 619, and powder container 618 are controlled does not affect the efficacy of the set-up of FIG. 6E.

Before container 611 and powder container 618 reach thermal equilibrium, it is possible for lithium oxide powder to flow into container 611 along with lithium oxide vapor. The idea behind the set-up of FIG. 6E is to prevent lithium oxide vapor from traveling into container 611 until container 611 and powder container 618 reach thermal equilibrium. In one embodiment, this is done by keeping tube 619 at a temperature lower than that of powder container 618 until thermal equilibrium is reached. Doing so allows lithium oxide vapor to condense in tube 619 and prevent the passage of lithium oxide powder into container 611. When thermal equilibrium is reached, tube 619 is allowed to be heated to thermal equilibrium (e.g., by turning OFF its cooling mechanism and then heating the tube), thereby enabling lithium oxide vapor to flow through tube 619 and enter container 611.

In another embodiment of the present invention, the wafers to be processed ("target wafers") are placed in a vessel interspersed by two-phase lithium-rich sources. To maximize wafer space in the vessel, each two-phase lithium-rich source preferably has compact dimensions and a large surface area. The vessel is preferably sealed but may also be leaky. This embodiment is now further described with reference to FIG. 7A.

Figure 7A:
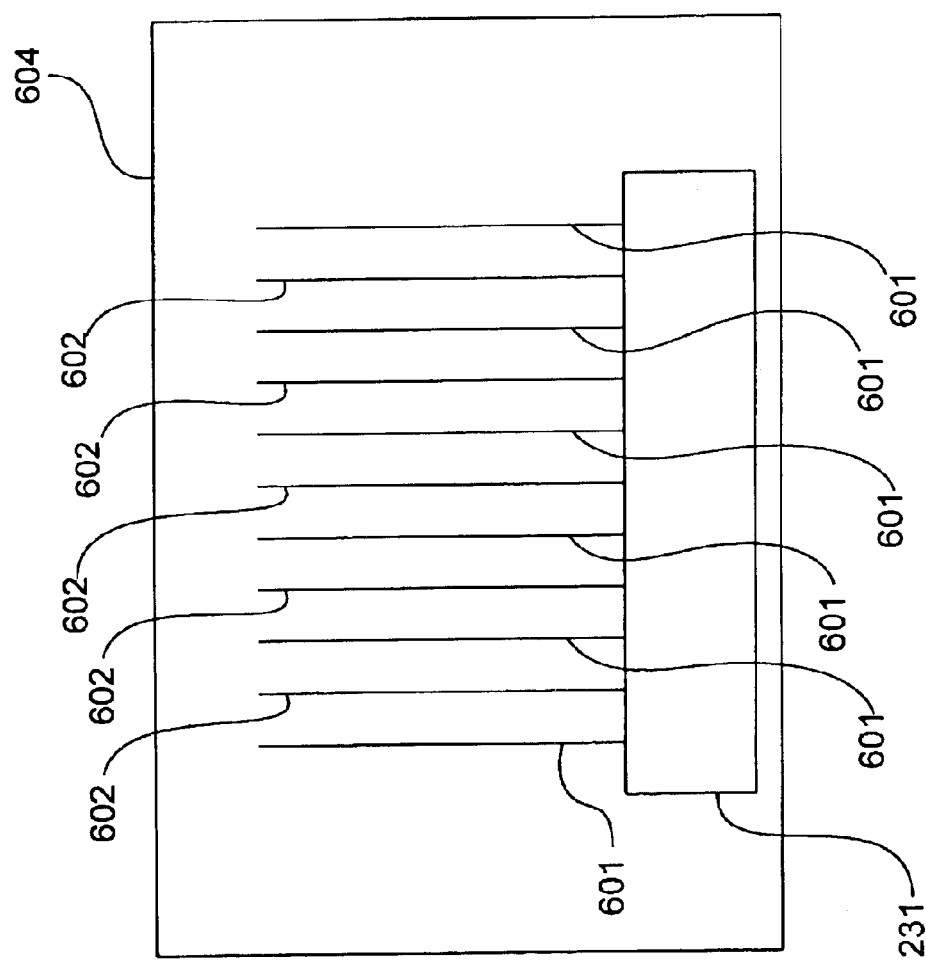
FIG. 7A shows a schematic diagram of a vessel containing target wafers interspersed by two-phase lithium-rich sources, in accordance with an embodiment of the present invention.

FIG. 7A shows a schematic diagram of a vessel 604 containing target wafers 602 interspersed by two-phase lithium-rich sources 601. Vessel 604 may be a sealed or leaky vessel. A wafer carrier 231 holds target wafers 602 inside vessel 604.

In FIG. 7A, each two-phase lithium-rich source 601 may be a sintered two-phase lithium-rich lithium tantalate wafer, which may be a mixture of stoichiometric lithium tantalate ($LiTaO_3$) and a lithium-rich phase ($Li_3TaO_4$) The just mentioned sintered wafers need only be large enough to contain enough excess lithium oxide for one run, after which they are crushed and recycled with the addition of lithium carbonate powder to create new sintered wafers. If vessel 604 is sealed, the sintered wafers may have dimensions similar to that of the target wafers. This allows for nearly 50% utilization of a process tube flat zone volume, resulting in significant throughput improvement compared to other techniques. If vessel 604 is a leaky vessel, the volume of the sintered wafers may be increased to compensate for the leak.

A thick disk of sintered two-phase lithium-rich lithium tantalate powder may also be used as a two-phase lithium-rich source 601.

Figure 7B:
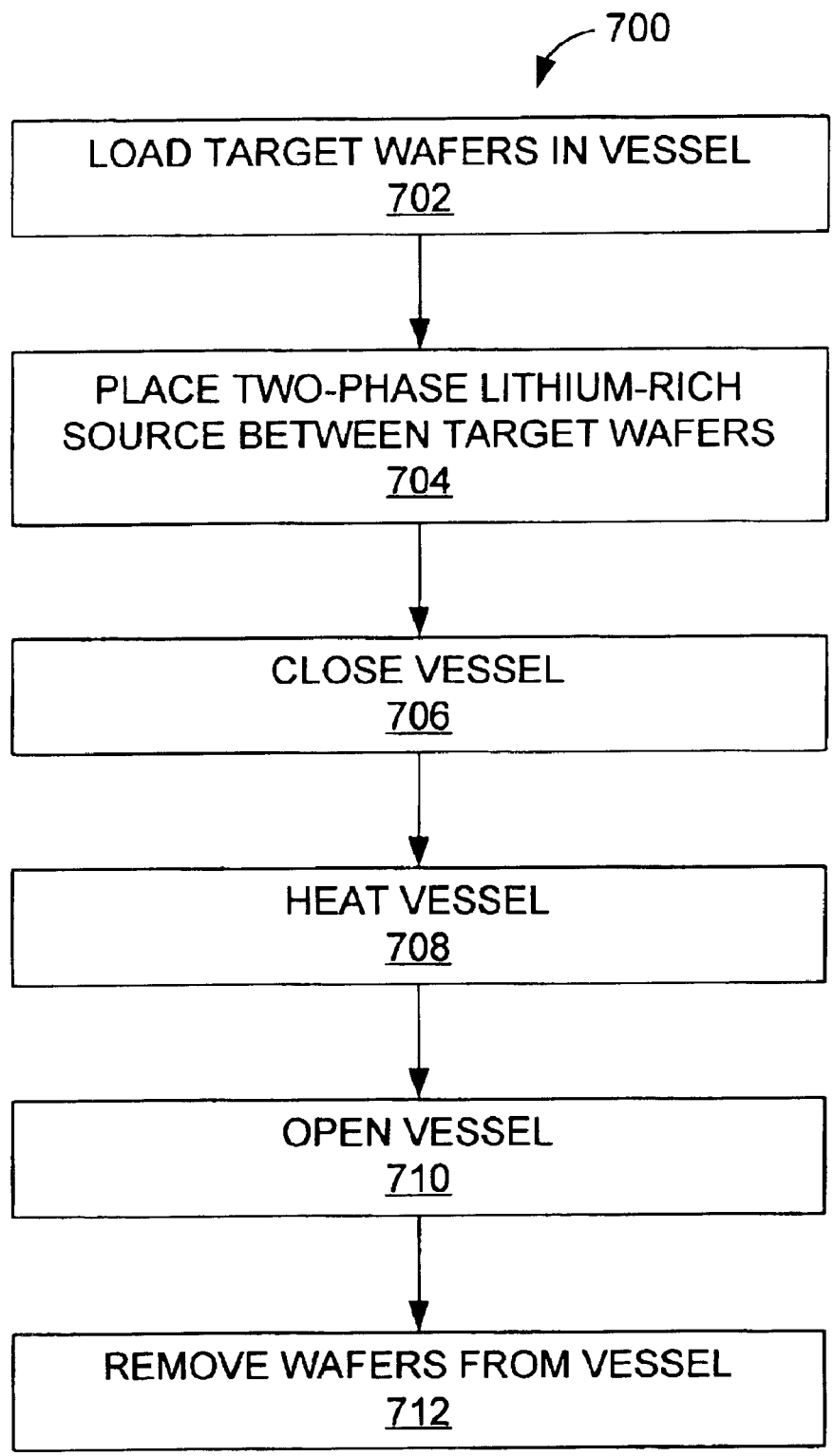
FIG. 7B shows a flow diagram of a process for adjusting the lithium oxide concentration in wafers using interspersed lithium oxide sources, in accordance with an embodiment of the present invention.

FIG. 7B shows a flow diagram of a process 700 for adjusting the lithium oxide concentration in a wafer using interspersed two-phase lithium-rich sources. In action 702, target wafers 602 are placed inside a vessel 604. In one embodiment, target wafers 602 are unpolished CLT wafers. Other wafers having lithium oxide concentration below 50 mol % may also be used.

In action 704, two-phase lithium-rich sources 601 are placed between target wafers. In action 706, vessel 604 is closed.

In action 708, vessel 604 is placed and heated in a furnace. Vessel 604 is heated to a temperature high enough to emanate lithium oxide vapor from the two-phase lithium-rich sources 601 inside vessel 604. Target wafers 602 will absorb lithium oxide from the two-phase lithium-rich sources 601 until the vapor pressure of the surrounding lithium oxide equals the vapor pressure of stoichiometric lithium tantalate over the surface of the target wafers. At that time, vapor transport will reach equilibrium and target wafers 602 will stop absorbing lithium oxide. Also at that time, target wafers 602, which were originally CLT wafers having a lithium oxide concentration of approximately 48.5 mol %, will have a final lithium oxide concentration of about 50 mol % (stoichiometric concentration).

In action 710, vessel 604 is opened. In action 712, target wafers 602 are removed from vessel 604. Target wafers 602 may then be polished in a subsequent polishing operation.

Figure 8:
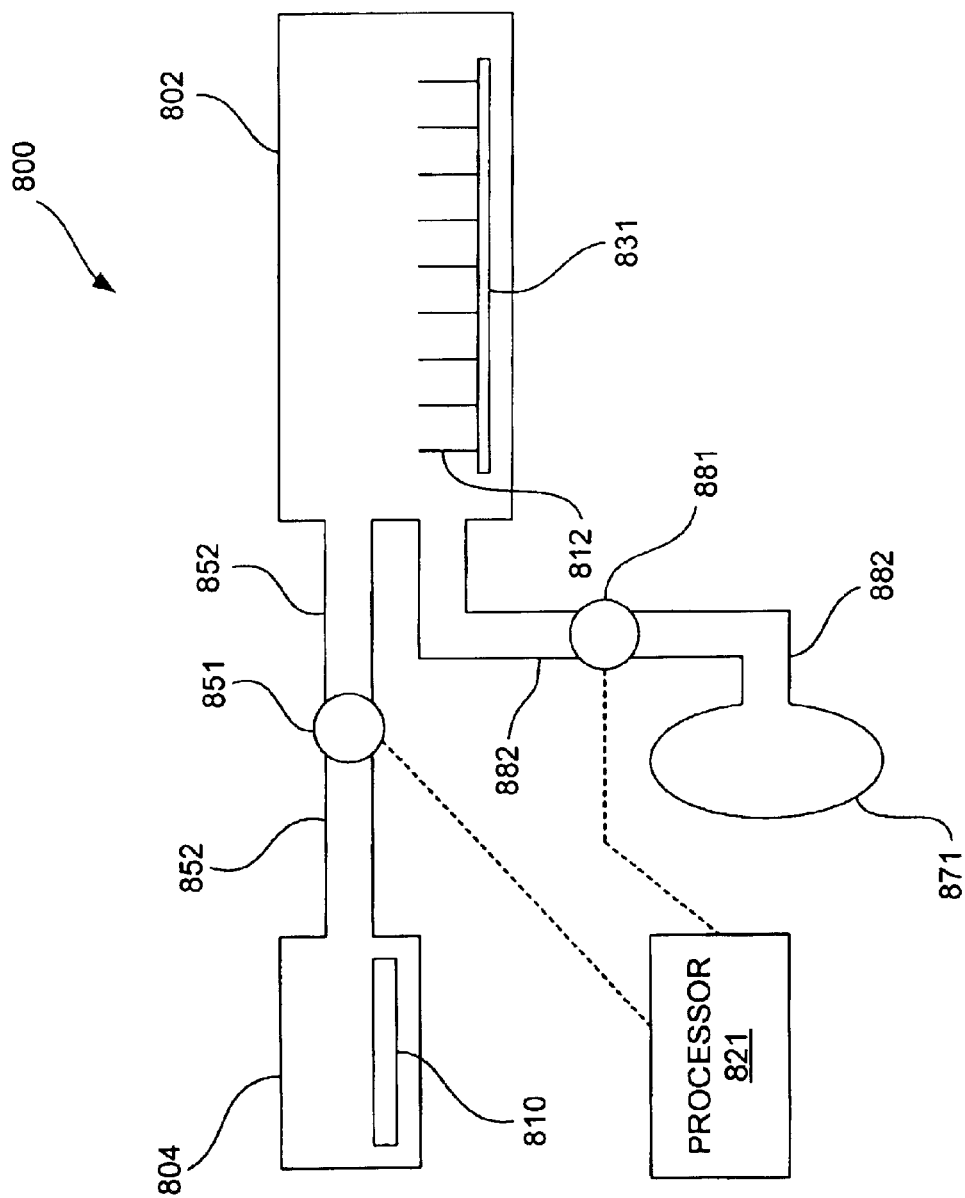
FIG. 8 shows a process environment in accordance with another embodiment of the present invention.

FIG. 8 shows a process environment 800 in accordance with another embodiment of the present invention. In process environment 800, a process tube 802 of a furnace is coupled to a chamber 804 via a mass flow controller 851 and plumbing 852. Chamber 804 includes a container 810 containing a source of lithium oxide. In one embodiment, container 810 contains lithium oxide powder. Chamber 804, and the other chambers disclosed herein, may be any type of sealed cavity that can be heated to temperatures high enough to vaporize lithium oxide powder. For example chamber 804 may be a tank, a vessel, a sealed section of a process tube, etc. When chamber 804 is heated (e.g., to approximately 700° C.), lithium oxide powder in container 810 is transformed into vapor. The lithium oxide vapor flows through mass flow controller 851 and into process tube 802. Mass flow controller 851 and plumbing 852 are heated to prevent the lithium oxide vapor from precipitating.

Process tube 802 is also coupled to a tank 871 via a mass flow controller 881 and plumbing 882. Tank 871 contains a heated carrier gas, which in this embodiment includes oxygen. The carrier gas flows through mass flow controller 881 and into process tube 802. Oxygen is a preferred carrier gas because lithium tantalate wafers are, generally speaking, metal oxide compounds; using an oxygen carrier gas replenishes the oxygen lost by the wafers during processing. Other carrier gases may also be used. For example, clean dry air (CDA) may be used as a carrier gas depending on implementation.

Inside process tube 802, wafers 812 (the wafers to be processed) sit on a wafer tray 831. Lithium oxide vapor entering process tube 802 are carried over wafers 812 by the carrier gas from tank 871. As will be explained below, the carrier gas also allows for adjustment of the partial pressure of lithium oxide in process tube 802. A processor 821 is coupled to mass flow controllers 851 and 881 to control the amount of lithium oxide vapor and carrier gas entering process tube 802. Processor 821 may be a computer, a programmable logic controller, microcontroller, etc. Of course, mass flow controllers 851 and 881 may also be manually controlled depending on implementation.

Figure 9:
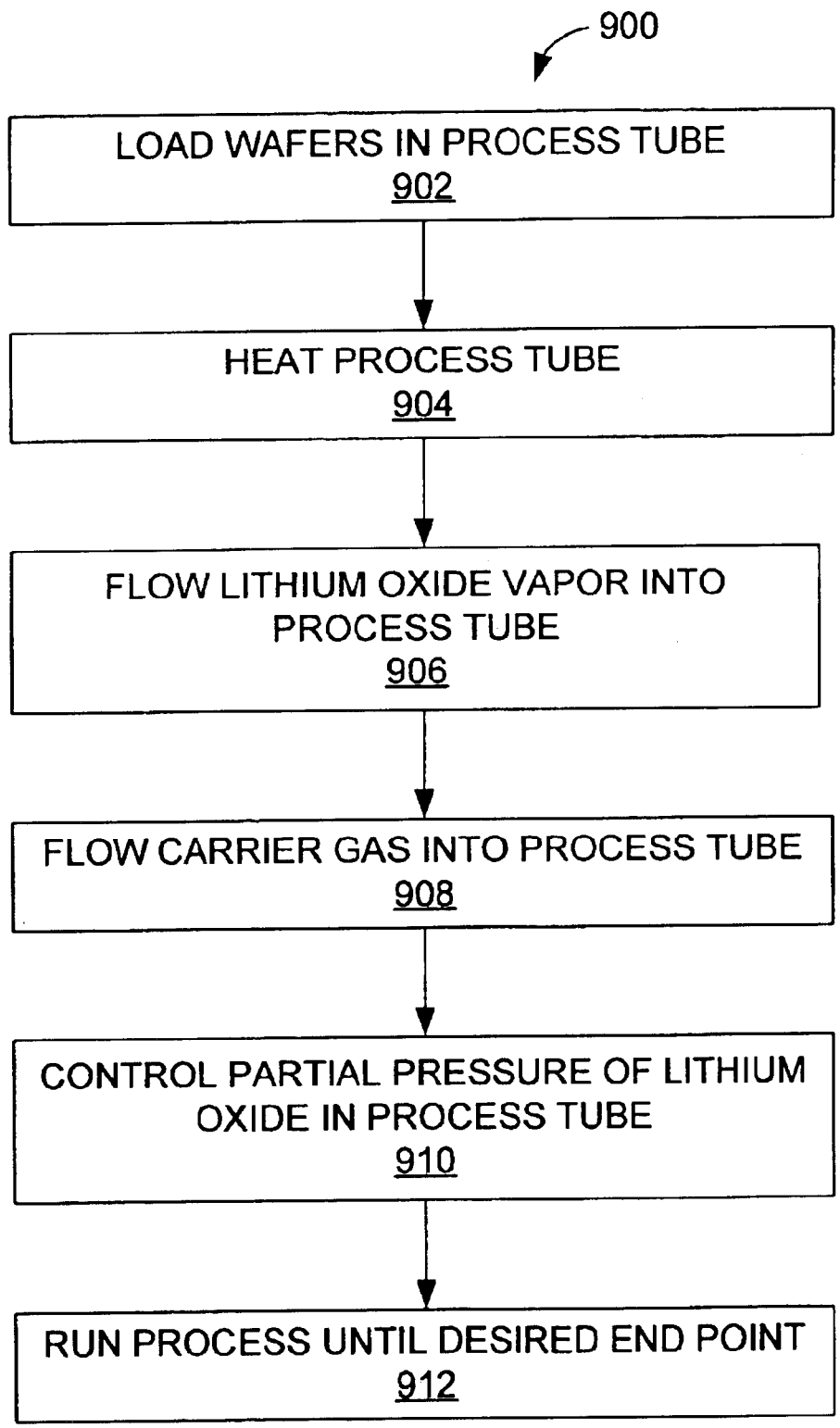
FIG. 9 shows a flow diagram of a process for adjusting the lithium oxide concentration in a wafer in accordance with an embodiment of the present invention.

FIG. 9 shows a flow diagram of a process 900 for adjusting the lithium oxide concentration in a wafer using a process environment 800. As will be explained later on below, process 900 may also be used with other process environments.

In action 902, the wafers to be processed are placed in process tube 802. In one embodiment, the wafers are CLT wafers. Other wafers having lithium oxide concentration below 50 mol % may also be used.

In action 904, the heating elements (not shown) of process tube 802 are energized to raise the temperature in the process tube (e.g., to 1350° C.).

In action 906, lithium oxide vapor is flown from chamber 804 to process tube 802. The amount of lithium oxide vapor flowing into process tube 802 is metered by mass flow controller 851.

In action 908, carrier gas is flown from tank 871 to process tube 802. The amount of carrier gas flowing into process tube 802 is metered by mass flow controller 881.

In action 910, the partial pressure of lithium oxide in process tube 802 is controlled by controlling the mass flow rates of lithium oxide vapor and/or carrier gas. As is well known, the ratio of mass flow rates of a first gas and a second gas sets the mass ratio in the mixture of the two gases. Thus, by reading mass flow controllers 851 and 881, the partial pressure of lithium oxide in the process tube can be calculated. Such a partial pressure calculation may be performed by processor 821, for example. Adjusting the mass flow rate of the carrier gas and/or lithium oxide vapor, by throttling their respective mass flow controllers, allows for control of the partial pressure of lithium oxide in process tube 802.

In one embodiment, the partial pressure of lithium oxide in process tube 802 is increased over a period of time to minimize the pressure differential between wafers 812 and the surrounding atmosphere, thereby preventing strain-related damage to the surface of the wafers. At the beginning of the process, the partial pressure of lithium oxide in process tube 802 is set at a low value close to the beginning lithium tantalate vapor pressure over the surface of wafers 812. As wafers 812 absorb lithium oxide, the lithium tantalate vapor pressure over their surface begins to increase. The partial pressure of lithium oxide in process tube 802 is then correspondingly increased by adjusting mass flow controller 851 and/or mass flow controller 881. The optimum rate of increase of lithium oxide partial pressure may be calculated or empirically determined.

Figure 10:
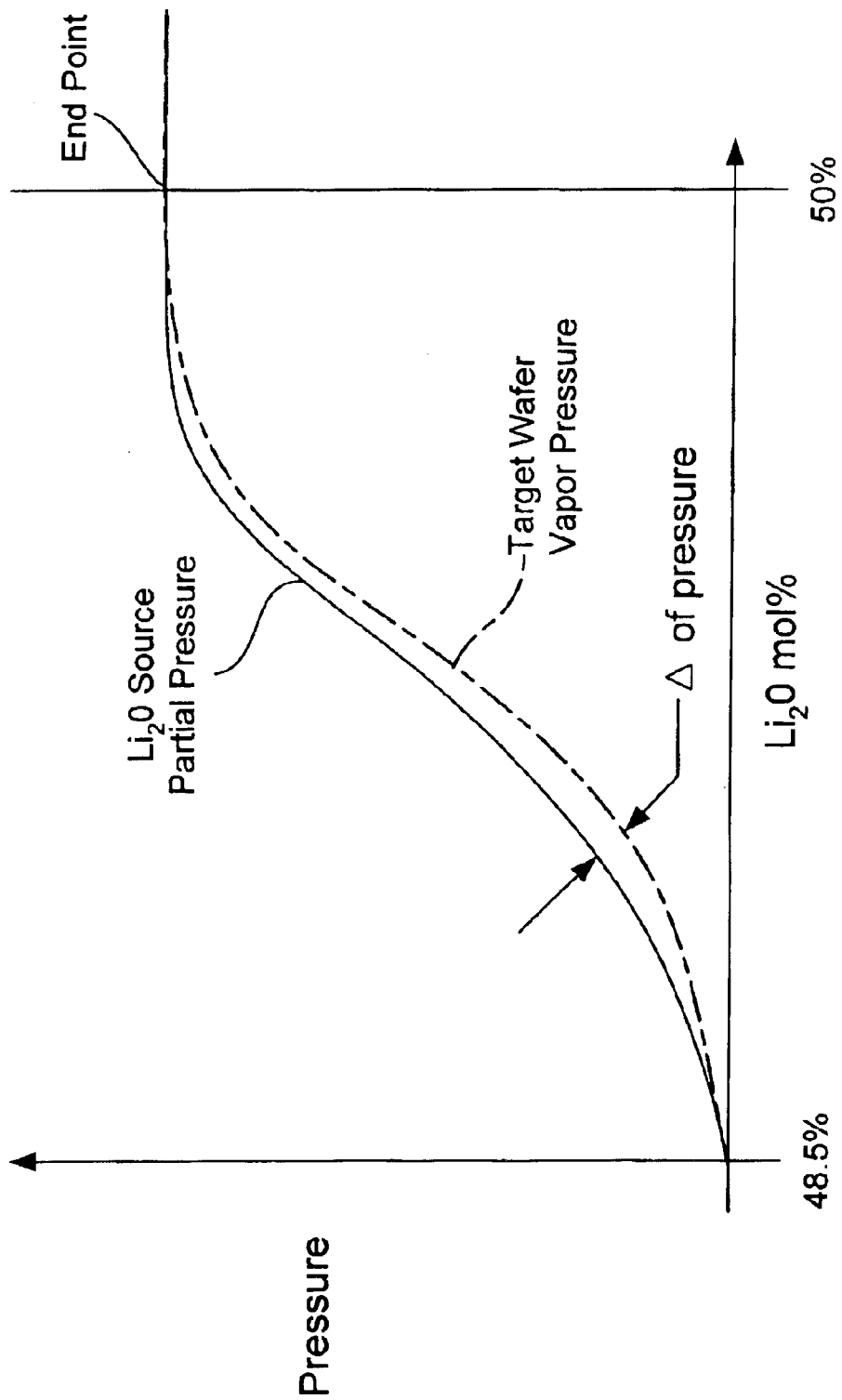
FIG. 10 shows a graph illustrating the pressure differential between a target wafer and a lithium oxide source.

FIG. 10 shows a graph further illustrating the above concept. As shown in FIG. 10, the vapor pressure over the surface of a target wafer starts at a minimum value dictated by its initial lithium oxide concentration, which is approximately 48.5 mol % in this example. As the wafer absorbs lithium oxide, the partial pressure of lithium oxide inside process tube 802 is increased to track the increasing vapor pressure over the surface of the wafer. This results in a small pressure differential between the wafer and the surrounding lithium oxide. The inventors believe that a high pressure differential between the wafer and the surrounding lithium oxide results in very high lithium oxide absorption rates. This can cause strain-related damage at the surface of the wafer in some applications. Thus, by minimizing the pressure differential, the present embodiment improves the quality of the resulting wafers.

Continuing with action 912, process 900 is terminated when wafers 812 reach a target composition, which may be non-stoichiometric (e.g., 49.5 mol %). Once the target composition is reached, parameters of process 900 may be ramped down to minimize defects. The process time of process 900 may be calculated or empirically determined. Other process parameters such as mass flow controller settings may also be empirically determined to suit specific applications.

Figure 11:
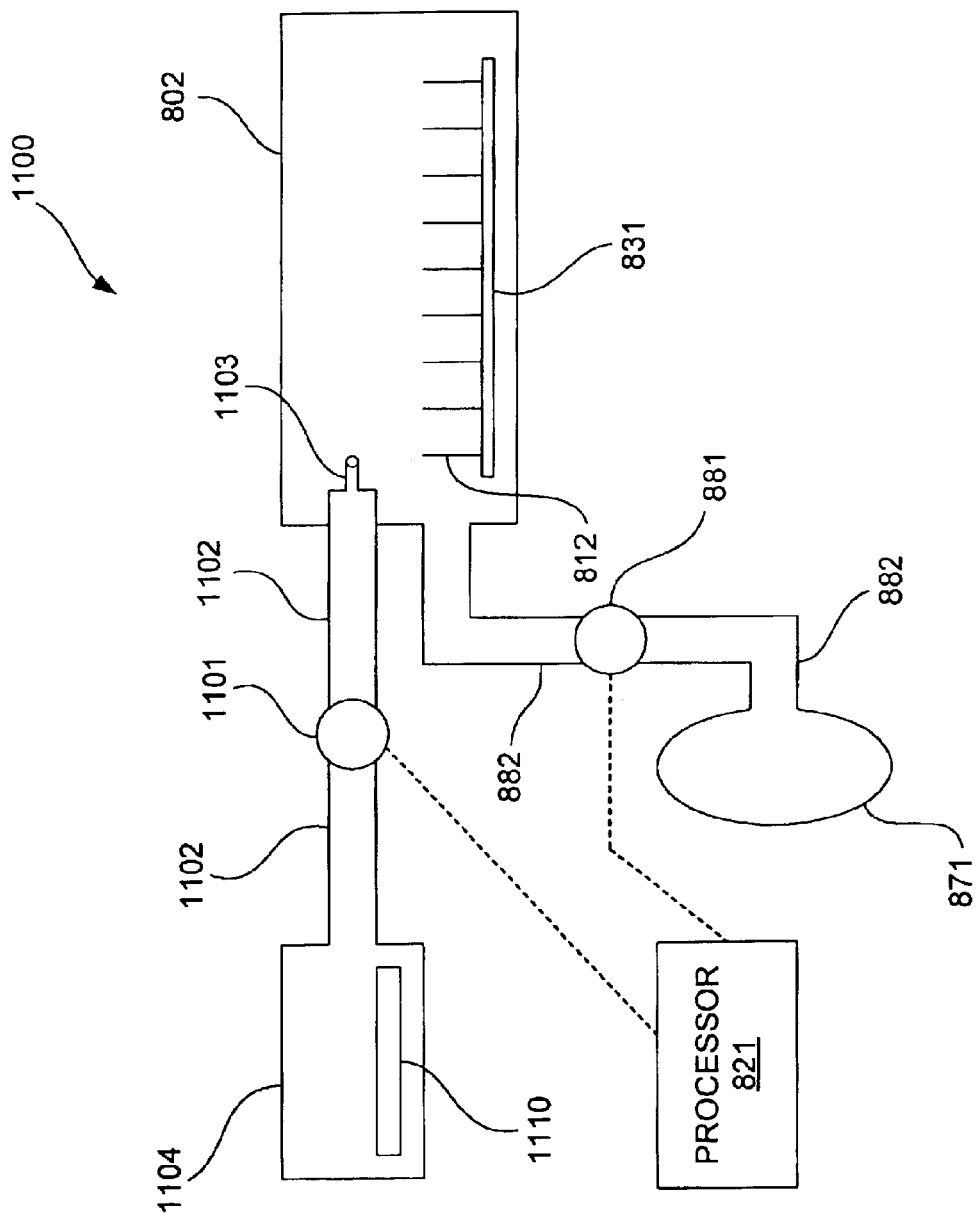
FIGS. 11, 12, and 13 show schematic diagrams of process environments in accordance with embodiments of the present invention.

FIG. 11 shows a schematic diagram of a process environment 1100 in accordance with another embodiment of the present invention. In process environment 1100, wafers are processed as in process 900 except that the lithium oxide vapor is created by heating a solution in chamber 1104. Process environment 1100 has the added benefit of not having to heat plumbing external to process tube 802 because, as explained below, the solution is vaporized in the process tube.

In one embodiment, the solution in chamber 1104 includes lithium hydroxide and water. The solution is pumped at room temperature through plumbing 1102, mass flow controller 1101, and an extension tube 1103. Extension tube 1103 protrudes into a region of process tube 802 where the temperature is sufficient to vaporize the solution. The length of extension tube 1103 depends on the temperature in the region of process tube 802 where extension tube 1103 protrudes. Additional heating elements may be placed in that process tube region to minimize the length of extension tube 1103.

The carrier gas from tank 871 (e.g., heated oxygen) carries the resulting steam and lithium hydroxide vapor into the hot zone of process tube 802. There, the temperature is sufficient to dissociate the lithium hydroxide to form lithium oxide as described by the following reaction, $$2LiOH \xrightarrow{heat} Li_2O + H_2O$$

By controlling the concentration of lithium hydroxide in the solution and the mass flow rates of the solution and/or the carrier gas, the partial pressure of lithium oxide in the hot zone where wafers 812 are located can be controlled. The resulting lithium oxide vapor is absorbed by wafers 812 as in process 900.

Figure 12:
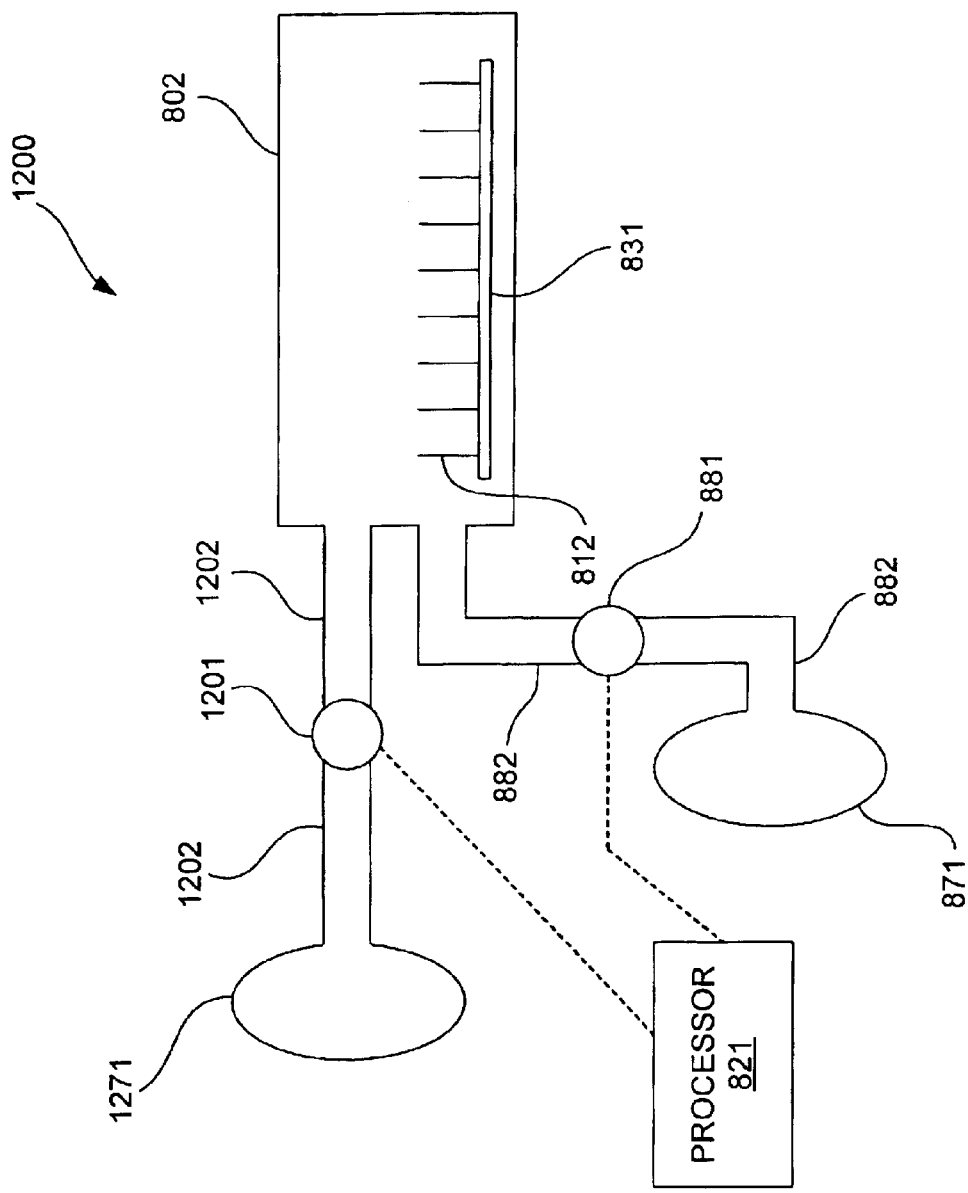

FIG. 12 shows a schematic diagram of a process environment 1200 in accordance with another embodiment of the present invention. In process environment 1200, wafers are processed as in process 900 except that the lithium oxide vapor is created from the reaction of an oxygen carrier gas with a metallo-organic gas that contains lithium. A metallo-organic gas, generally speaking, is an organic molecule with a metallic ion attached to it. Such metallo-organic gases are commonly used in metal organic chemical vapor deposition (MOCVD) processes.

Referring to FIG. 12, tank 1271 supplies a lithium-containing metallo-organic gas to process tube 802 via plumbing 1202 and mass flow controller 1201. The carrier gas from tank 871, which is oxygen in this embodiment, carries the metallo-organic gas into the hot zone of process tube 802. There, lithium from the metallo-organic gas reacts with oxygen to form lithium oxide. Other by-products of the reaction include carbon dioxide and carbon monoxide from the reaction of oxygen with carbon. By controlling the mass flow rates of the metallo-organic gas and oxygen, the partial pressure of lithium oxide in the hot zone where wafers 812 are located can be controlled. The resulting lithium oxide vapor is absorbed by wafers 812 as in process 900.

Process environment 1200, like process environment 1100, has the added benefit of not having to heat plumbing external to process tube 802 because the lithium oxide vapor is created in process tube 802. Additionally, process environment 1200 uses a gas as a lithium source. As can be appreciated, gases are easier to control in a process environment compared to liquids.

Figure 13:
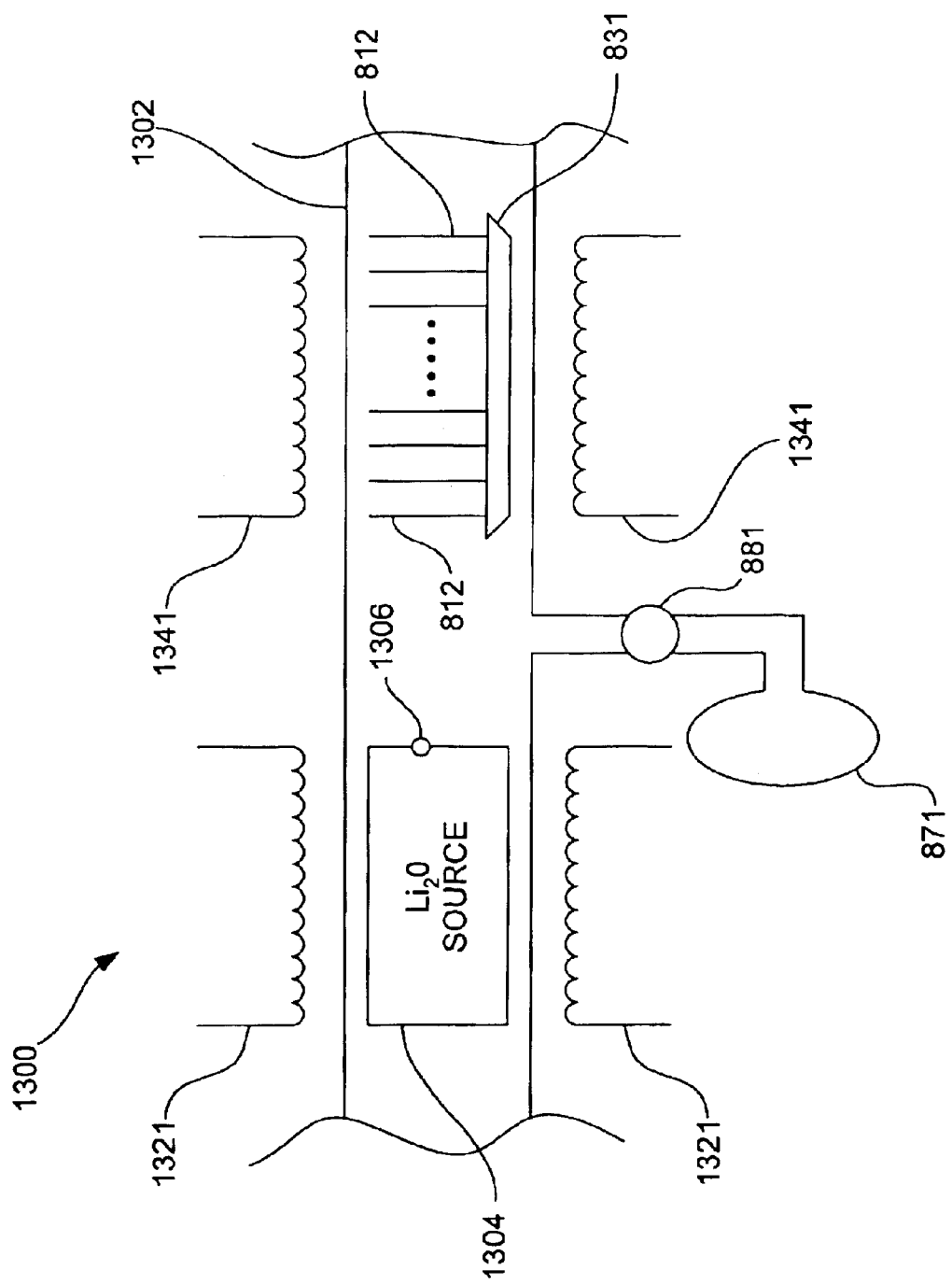

FIG. 13 shows a process environment 1300 in accordance with another embodiment of the present invention. In process environment 1300, wafers are processed as in process 900 except that the lithium oxide vapor is created from a lithium oxide source located inside a process tube 1302.

Referring to FIG. 13, a lithium oxide source is provided inside a vessel 1304. Vessel 1304 includes a pinhole 1306 of known diameter. Vessel 1304 is placed on a zone of process tube 1302 where the temperature is controlled by heating elements 1321. Wafers 812 are on another zone of process tube 1302 where the temperature is controlled by heating elements 1341. As can be appreciated, heating elements 1321 and 1341 are depicted in FIG. 13 for illustration purposes only; the type of heating arrangement does not affect the efficacy of the present invention.

In one embodiment, the lithium oxide source in vessel 1304 includes lithium oxide powder. Lithium oxide at a certain temperature has a corresponding pressure. Thus, when vessel 1304 is heated (e.g., above 660° C.), the resulting lithium oxide vapor will come out of pinhole 1306 at a certain pressure. The temperature of vessel 1304 and the size of pinhole 1306 dictate the mass flow rate of lithium oxide vapor out of vessel 1304 and into process tube 1302, independent of the mass or surface area of lithium oxide powder inside the vessel. The temperature of vessel 1304 can be controlled by controlling heating elements 1321 or by moving vessel 1304 to different sections of process tube 1302.

In process environment 1300, a carrier gas carries the escaping lithium oxide vapor from vessel 1304 to the hot zone of process tube 1302 where wafers 812 are located. The carrier gas (e.g., oxygen) comes from tank 871 and flows through mass flow controller 881. By controlling the mass flow rate of the carrier gas and the temperature of vessel 1304, the partial pressure of lithium oxide vapor surrounding wafers 812 can be controlled. Lithium oxide vapor is absorbed by wafers 812 as in process 900.

While specific embodiments of the present invention have been provided, it is to be understood that these embodiments are for illustration purposes and not limiting. Many additional embodiments will be apparent to persons of ordinary skill in the art reading this disclosure. Thus, the present invention is limited only by the following claims.

What is claimed is:

1. A method for adjusting lithium oxide concentration in a wafer, the method comprising:
   creating lithium oxide vapor from a lithium oxide source in a sealed cavity; and
   absorbing the lithium oxide vapor into a wafer to obtain a final lithium oxide concentration.

2. The method of claim 1 wherein the lithium oxide source includes lithium oxide powder.

3. The method of claim 1 wherein the final lithium oxide concentration is about 50 mol %.

4. The method of claim 1 wherein the final lithium oxide concentration is less than 50 mol %.

5. The method of claim 1 wherein the entirety of the lithium oxide source is consumed during processing of the wafer.

6. The method of claim 5 wherein the lithium oxide source is of an amount that will result in the final lithium oxide concentration in the wafer to be approximately 50 mol %.

7. The method of claim 5 wherein the lithium oxide source is of an amount that will result in the final lithium oxide concentration in the wafer to be less than approximately 50 mol %.

8. The method of claim 1 wherein the sealed cavity includes a hermetically sealed vessel.

9. The method of claim 1 wherein the lithium oxide source consists essentially of lithium oxide.

10. A method of adjusting lithium oxide concentration in a wafer, the method comprising:
    creating lithium oxide vapor from a lithium oxide source in a sealed cavity, the lithium oxide source being of a predetermined amount to compensate for a leak in the cavity; and
    absorbing the lithium oxide vapor into a wafer to obtain a final lithium oxide concentration.

11. The method of claim 10 wherein the lithium oxide source includes lithium oxide powder.

12. The method of claim 10 wherein the lithium oxide source consists essentially of lithium oxide.

* * * * *